United States Patent [19]

Hinton et al.

[11] Patent Number: 4,952,791
[45] Date of Patent: Aug. 28, 1990

[54] MONOLITHIC APPARATUS COMPRISING OPTICALLY INTERCONNECTED QUANTUM WELL DEVICES

[75] Inventors: Harvard S. Hinton, Naperville; Anthony L. Lentine, St. Charles, both of Ill.; David A. B. Miller, Fairhaven, N.J.

[73] Assignee: AT&T Bell Laboratories, Murray Hill, N.J.

[21] Appl. No.: 283,336

[22] Filed: Dec. 12, 1988

[51] Int. Cl.⁵ ............................................. H01J 40/14
[52] U.S. Cl. .............................. 250/211 J; 250/213 A; 377/102
[58] Field of Search ................. 250/211 J, 213 A; 377/102

[56] References Cited

U.S. PATENT DOCUMENTS 4,546,244 10/1985 Miller .................................. 250/211
4,751,378 6/1988 Hinton .............................. 250/211 J
4,754,132 6/1988 Hinton et al. ....................... 250/211
4,822,992 4/1989 Bar-Joseph ...................... 250/211 J

OTHER PUBLICATIONS

"Integrated Quantum Well Self-Electro-Optic Effect Device: 2×2 Array of Optically Bistable Switches", D. A. B. Miller et al., Appl. Phys. Lett. 49 (13), 29 Sep. 1986, pp. 821-823.

Primary Examiner—David C. Nelms
Assistant Examiner—Sherrie Hsia
Attorney, Agent, or Firm—Ross T. Watland

[57] ABSTRACT

Apparatus comprising a monolithic structure having an array of substructures, e.g., mesas, each including first and second photodetectors electrically connected as components of different self electro-optic effect devices. The devices are optically interconnected due to the positioning of the component photodetectors within a single mesa.

15 Claims, 10 Drawing Sheets

MONOLITHIC APPARATUS COMPRISING OPTICALLY INTERCONNECTED QUANTUM WELL DEVICES

TECHNICAL FIELD

This invention relates to nonlinear optical devices.

BACKGROUND AND PROBLEM

A nonlinear, bistable optical device, referred to as a self electro-optic effect device (SEED) and described in U.S. Pat. No. 4,546,244 issued to D. A. B. Miller on Oct. 8, 1985, has a semiconductor quantum well region that is electrically controlled to change the state of the device via a photodetector. Many SEED devices must be interconnected in typical signal processing applications such as optical computing or photonic switching. Two approaches have been proposed for interconnecting the devices. In one approach, the devices are constructed in a manner where optical signals travel through the devices in optical waveguides. Waveguides are also used to interconnect several devices on a chip in a manner similar to that used for titanium-diffused lithium niobate directional couplers. Devices on different chips are then interconnected with optical fibers. A disadvantage of this approach is that not many devices can be integrated on a single substrate because of the amount of room required for the waveguide interconnections.

A second approach is to build the devices in two-dimensional arrays, where the optical signals travel normal to the plane of the devices. The devices are optically interconnected using bulk optical elements such as lenses and beam splitters. However, the bulk element arrangements required to perform even relatively simple optical interconnections may be quite complex.

In view of the foregoing, a need exists in the art for a simple optical interconnection mechanism for interconnecting a large number of optical devices.

SOLUTION

The aforementioned need is met and a technical advance is achieved in accordance with the principles of the invention in an exemplary monolithic structure having an array of substructures, e.g., mesas, each including first and second photodetectors electrically connected as components of different self electro-optic effect devices. The devices are optically interconnected simply due to the positioning of the component photodetectors within a single substructure. Because of the monolithic construction, the number of interconnectable devices is restricted only by the size of the structure and the size and spacing of the individual substructures.

The apparatus of the invention comprises a monolithic structure with a first group of photodetector layers including a quantum well region and a second group of photodetector layers. Light transmitted through the quantum well region of the first group of photodetector layers is incident on the second group of photodetector layers. The structure has a number of individual substructures formed therein each having a first photodetector from the first group of photodetector layers and a second photodetector from the second group of photodetector layers. Electrical connections are provided to connect ones of the first and second photodetectors of ones of the substructures for operation in a predefined circuit comprising self-electro-optic effect devices that are optically interconnected within individual ones of the substructures.

In one embodiment, the second photodetector of a first substructure is electrically connected in parallel with the first photodetector of a second substructure for operation together with a load as a first self electro-optic effect device. The second photodetector of the second substructure is electrically connected in parallel with the first photodetector of a third substructure for operation together with a load as a second self electro-optic effect device optically interconnected with the first device.

In the other embodiments, the interconnected devices are symmetric self electro-optic effect devices comprising series-connected photodetector arrangements. In one such embodiment comprising a linear optical shift register, individual second photodetectors of a first pair of substructures are electrically connected in parallel with respective first photodetectors of a second pair of substructures for operation as a first symmetric self electro-optic effect device. Individual second photodetectors of the second pair of substructures are electrically connected in parallel with respective first photodetector of a third pair of substructures for operation as a second symmetric self electro-optic effect device optically interconnected with the first device. The second group of photodetector layers also includes a quantum well region such that light transmitted through the quantum well region of the second group of photodetector layers is incident on the first group of photodetector layers. The substructures are arranged as a planar array having two dimensions, with the individual substructures of a pair aligned in a first dimension and the three pairs of substructures aligned in the second dimension. The second self electro-optic effect device is optically interconnected with the first device for shifting optical data in either direction of the second dimension. Other embodiments include a symmetric self electro-optic effect device with a fan-out of two operable as a 1×2 optical switch, a two-dimensional shift register capable of shifting optical data in either direction of both dimensions, and an arrangement of two symmetric self electro-optic effect devices each optically interconnected with a third symmetric self electro-optic effect device for operation as an optical logic circuit or as a 2×1 optical switch.

DRAWING DESCRIPTION

Figure 9:
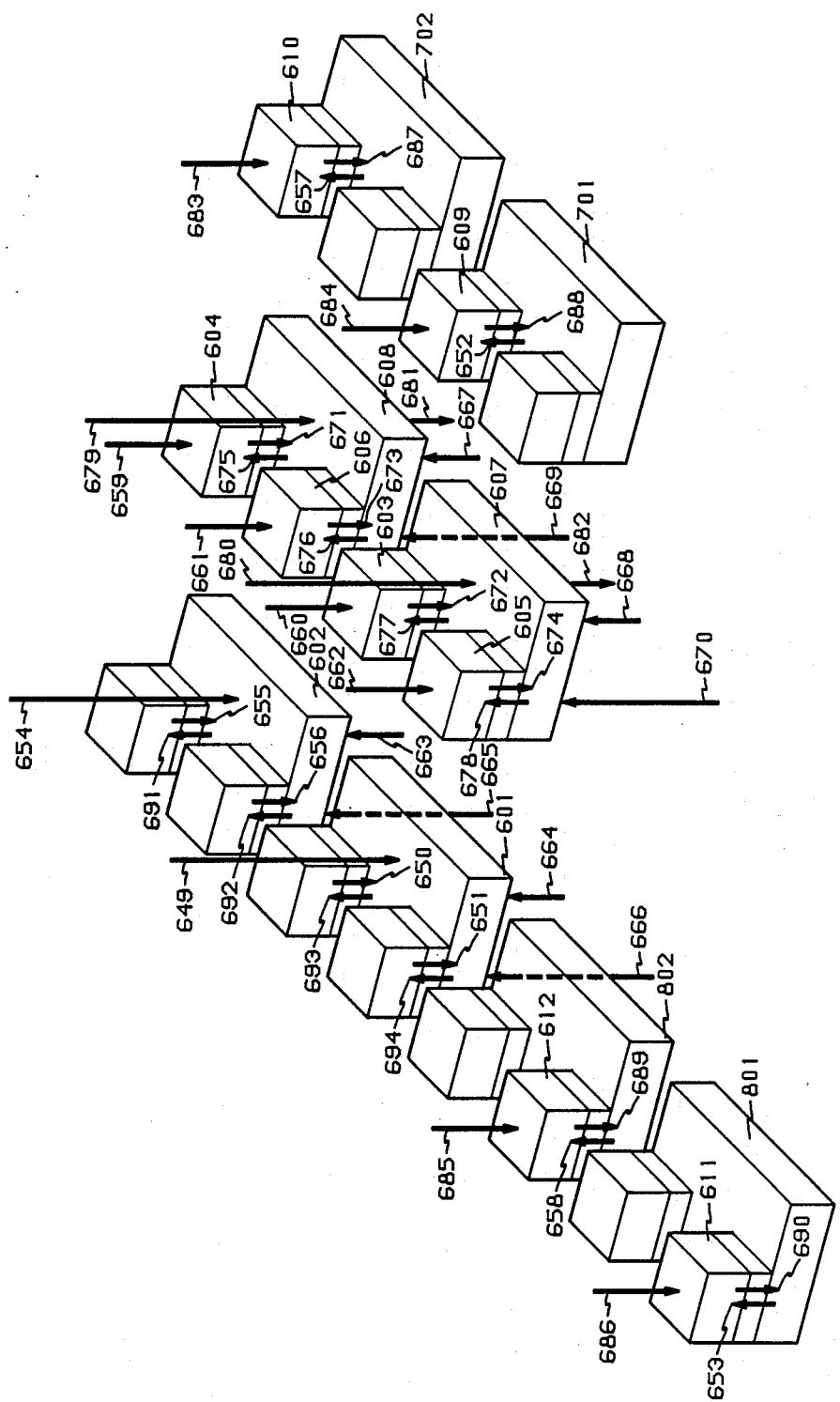
Figure 10:
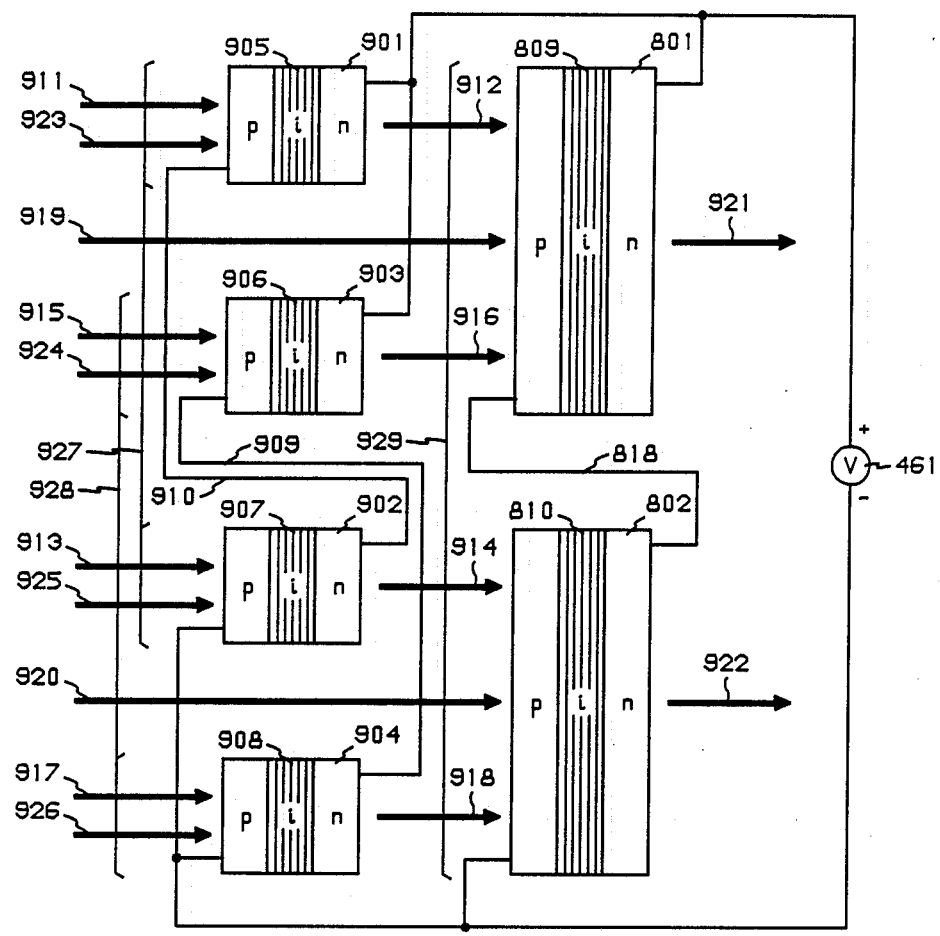

FIG. 9 is a diagram of an exemplary embodiment of the invention having an array of mesas in a monolithic structure and illustrating the optical interconnection of symmetric self electro-optic effect devices in a two-dimensional shift register; and FIG. 10 is a schematic diagram of an arrangement that may be constructed as a monolithic device comprising optically interconnected symmetric self electro-optic effect devices operable as an optical switch or as an optical logic circuit.

DETAILED DESCRIPTION

The optical devices used in the exemplary embodiments described herein are the above-referenced SEED devices. The first embodiment described involves such SEED devices generally. The remaining embodiments concern a specific type of SEED, referred to as a symmetric SEED (S-SEED), described in U.S. Pat. No. 4,754,132 issued to H. S. Hinton et al. on Jun. 28, 1988. The S-SEED is a device that acts as an optically bistable set-reset latch or flip-flop.

In the operation of a SEED there are typically several input beams. The input beams comprise signal beams and bias or clock beams. The signal beams determine the logic state of the device and the bias or clock beams provide the gain needed to cascade devices and to provide the output signal beam. In the basic SEED described in the above-referenced U.S. Pat. No. 4,546,244, the signal and bias beams are applied concurrently. In the S-SEED described in the above-referenced U.S. Pat. No. 4,754,132, the signal and clock beams are applied in a time sequential manner. The signal and bias or clock beams are typically applied to the same quantum well p-i-n diode photodetector. For the SEED devices used in the monolithic structure of the present invention, the signal beams are applied to a photodetector that is electrically connected in parallel with the quantum well photodetector that has the bias or clock beams incident thereon.

The exemplary monolithic structure of the present invention is fabricated as follows. First a wafer is grown using standard epitaxial growth techniques, such as molecular beam epitaxy. First and second groups of photodetector layers are separated by an insulating layer. The signal beams are incident on photodetectors of the first group of layers which may or may not include quantum wells. The bias or clock beams are incident on photodetectors of the second group of layers which must have quantum wells such that the logic states of individual SEED devices can be read out. Individual mesas are formed by etching through portions of the material and photodetectors are electrically interconnected by making ohmic contacts and using gold metalization over an insulating material such as polyimide or silicon nitride.

Figure 1:
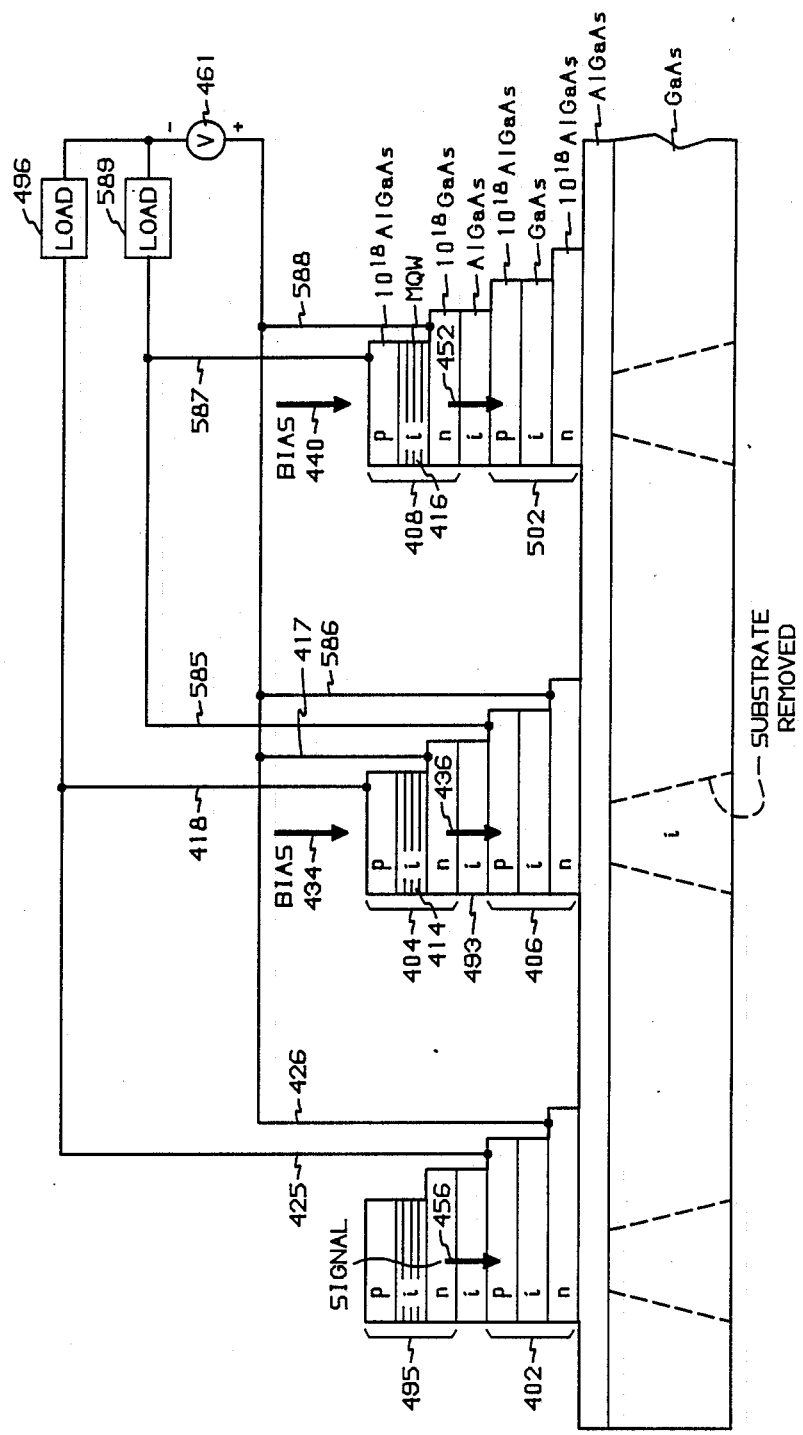
FIG. 1 is a diagram of an exemplary embodiment of the invention having three mesas in a monolithic structure and illustrating the optical interconnection of two self electro-optic effect devices.

FIG. 1 is a diagram of an illustrative optical apparatus comprising three substructures, e.g., mesas, in a monolithic structure—a first mesa comprising photodetectors 402 and 495, a second mesa comprising photodetectors 406 and 404, and a third mesa comprising photodetectors 502 and 408. Photodetectors 402 and 404, connected in parallel via conductors 425, 426, 418 and 417, together with series-connected load 496 operate as a SEED. Similarly, photodetectors 406 and 408, connected in parallel via conductors 585, 586, 587, and 588, together with series-connected load 589 operate as a second SEED. Loads 496 and 589 may be resistors, phototransistors, photodiodes, transistors, or any elements that convert a current change to a voltage change. (In the S-SEED, the load is a photodetector comprising a p-i-n diode with a quantum well region.) Electrical power is provided by a DC voltage source 461. The two SEEDs are cascaded in the device of FIG. 1 because of the use of two photodetectors electrically connected in parallel to operate together with a load as a single SEED and because of the positioning of the second photodetector of the first SEED and the first photodetector of the second SEED within a single mesa. Because of the positioning within the monolithic structure, light transmitted by the second photodetector of the first SEED is incident on the first photodetector of the second SEED. Signal beam 456, which is shown in FIG. 1 as being transmitted from photodetector 495 but which is also receivable from an external array of devices, is incident on photodetector 402. In response, photodetector 402 generates photocurrent which flows through load 496. Similarly, photodetector 404 responds to incident bias beam 434 by generating photocurrent that also flows through load 496. The voltage developed across load 496 in response to photocurrent effectively controls the optical absorption of quantum well region 414 of photodetector 404 thereby controlling the fraction of bias beam 434 that is transmitted from photodetector 404 through insulating layer 493 as the signal beam 436 to photodetector 406 of the second SEED. In response, photodetector 406 generates photocurrent which flows through load 589. Photodetector 408 responds to incident bias beam 440 by generating photocurrent that also flows through load 589. The voltage developed across load 589 in response to photocurrent effectively controls the optical absorption of quantum well region 416 of photodetector 408.

The remainder of the description involves the interconnection of S-SEEDs. Recall that the basic form of the S-SEED comprises two series-connected photodetectors each having quantum wells in the intrinsic region. Optical data is represented by two beams rather than one as in the basic form of the SEED. If the power in a first beam is greater than the power in a second beam, the S-SEED is in one logical state; otherwise, the S-SEED is in the other logical state. Since the S-SEED device is operated in time sequential fashion, there are two signal beams used to determine the state of the device and two clock beams that subsequently read the device state and provide optical gain necessary for cascading devices. In typical operation, one signal beam and one clock beam are incident on one photodetector of the S-SEED and a second signal beam and a second clock beam are incident on the other photodetector. However, in order to transfer data from one S-SEED to another in a planar structure, each photodetector is replaced by two photodetectors, one on which the signal beam is incident and a second on which the clock beam is incident. Only the second photodetector need have a quantum well region in order to obtain a cascaded structure that shifts optical data in one direction.

Figure 2:
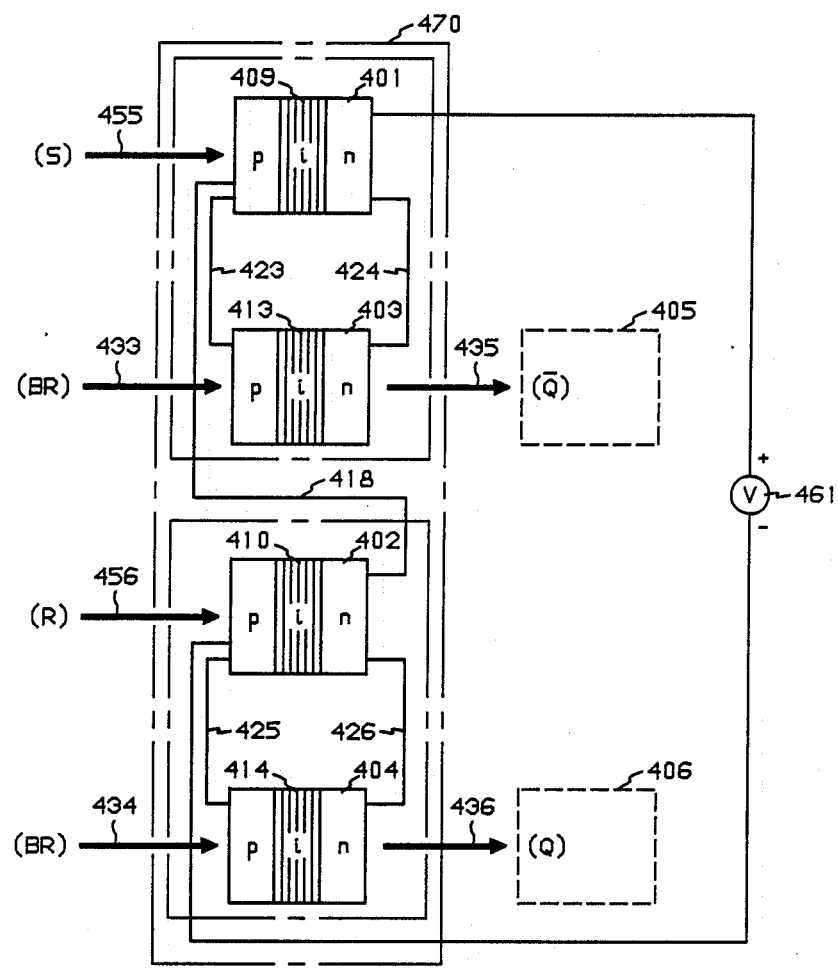
FIG. 2 is a schematic diagram of the components of a flip-flop comprising a symmetric self electro-optic effect device.
Figure 5:
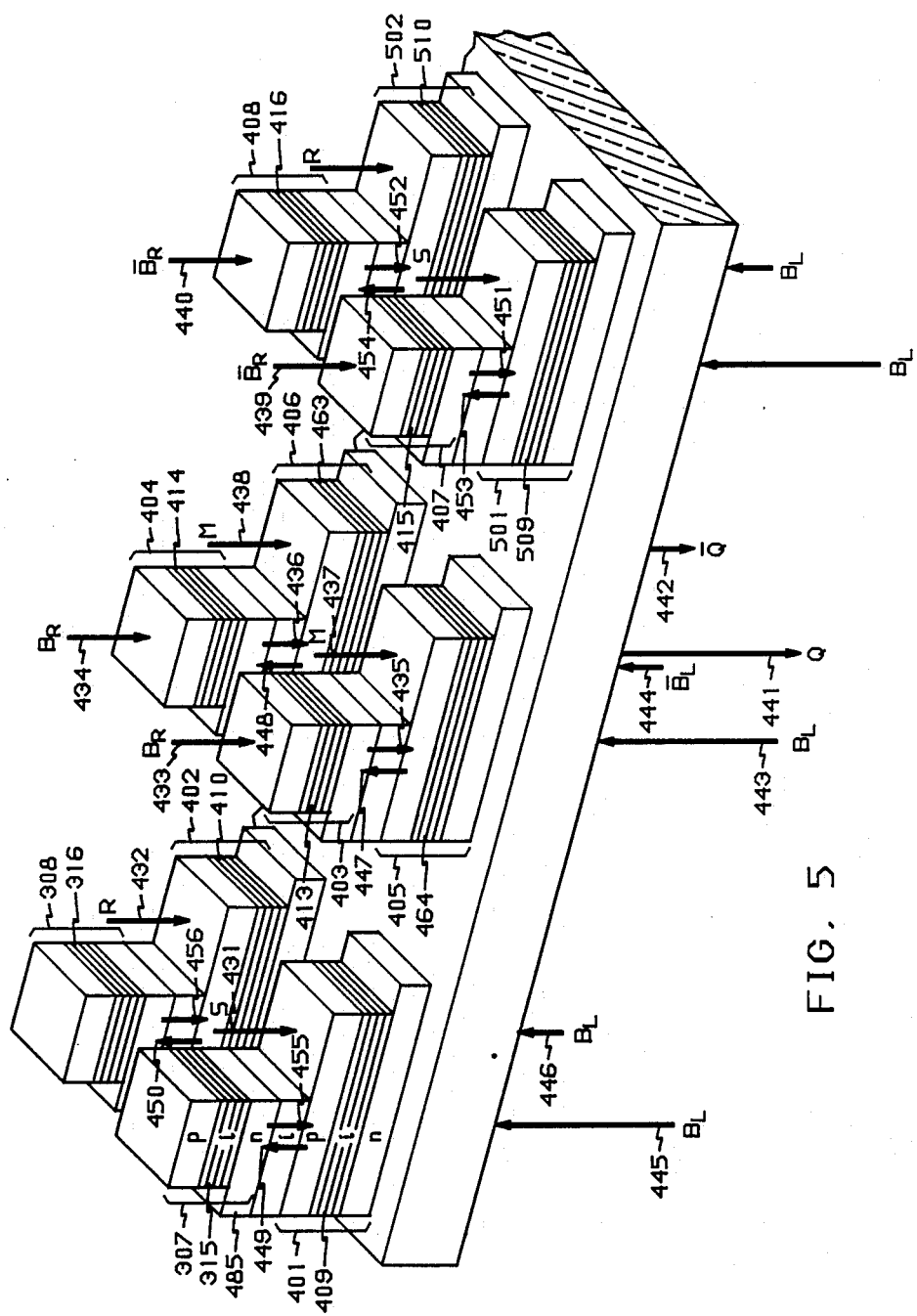
FIG. 5 is a diagram of an exemplary embodiment of the invention having an array of mesas in a monolithic structure illustrating the optical interconnection of symmetric self electro-optic effect devices in a linear shift register.

FIG. 2 is a schematic diagram of the components of an S-SEED flip-flop 470. A first pair of photodetectors 401 and 403 are connected in parallel via conductors 423 and 424; a second pair of photodetectors 402 and 404 are connected in parallel via conductors 425 and 426. The first and second pairs of photodetectors are connected in series via conductor 418. Electrical power is provided by DC voltage source 461. Signal beams 455 and 456 determine the absorption in the quantum well regions 413 and 414 to set the state of S-SEED flip-flop 470. Substantially equal clock beams 433 and 434 read out the state of S-SEED flip-flop 470. The output beams 435 and 436 have intensities dependent on the absorption in the quantum well regions 413 and 414, and are shown in FIG. 2 being transmitted to subsequent photodetectors 405 and 406. To operate in time-sequential fashion, it is necessary that clock beams 433 and 434 are of low intensity when the signal beams 455 and 456 are applied, and that the beams 455 and 456 are of low intensity when the high intensity clock beams 433 and 434 are subsequently applied to read the state. (The timing required for S-SEED operation is described in detail in the above-referenced U.S. Pat. No. 4,754,132.) The physical positioning of the components of S-SEED flip-flop 470 in a monolithic structure comprising cascaded S-SEEDs is shown in FIG. 5. Output beams 435 and 436 pass through insulating layers with little or no attenuation and are incident on photodetectors 405 and 406 that are part of a second S-SEED.

Figure 3:
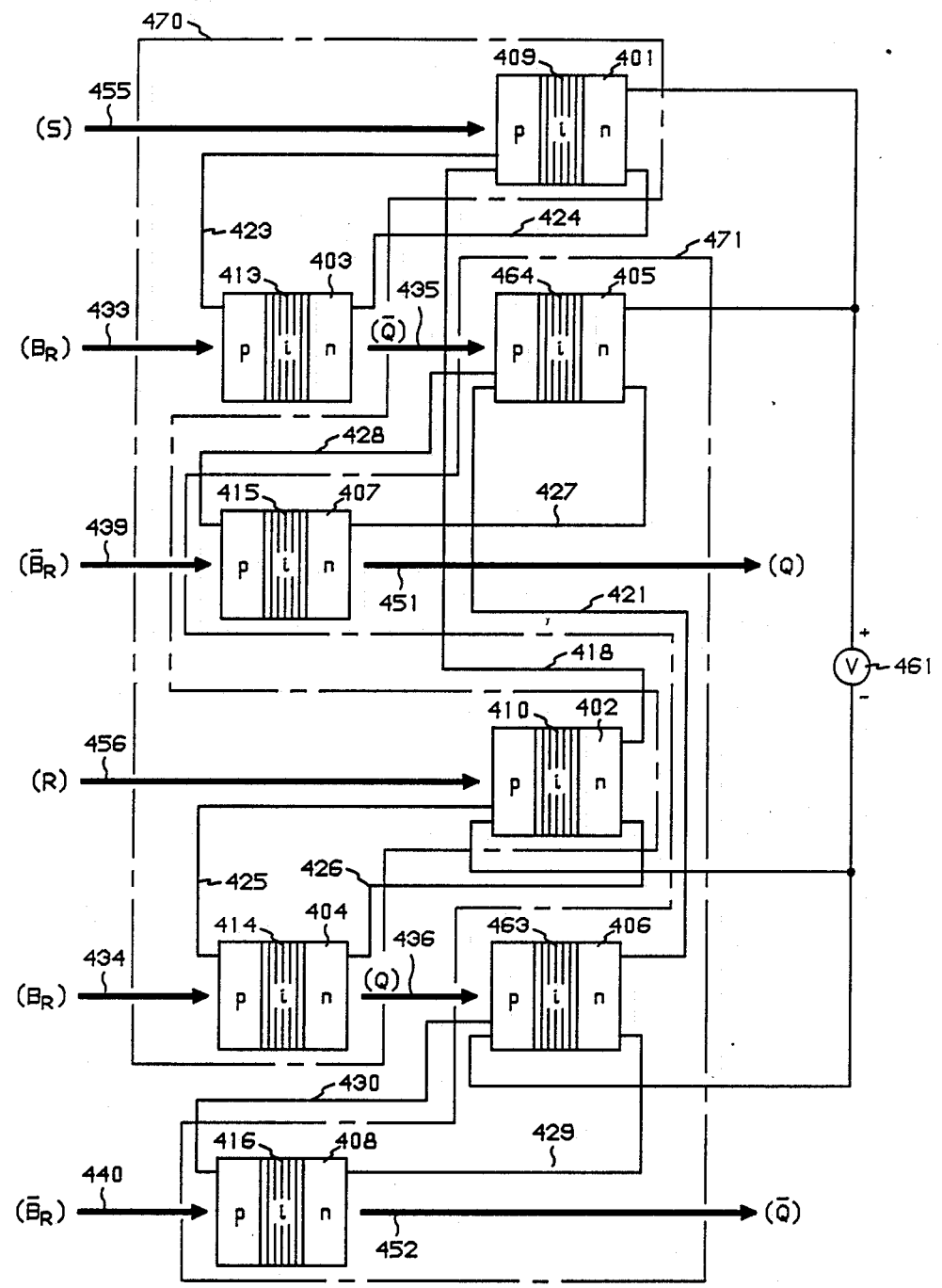
FIG. 3 is a schematic diagram of a master-slave arrangement comprising optically interconnected symmetric self electro-optic effect devices and illustrating the light beams used for right shifting in the linear shift register of FIG. 5.
Figure 4:
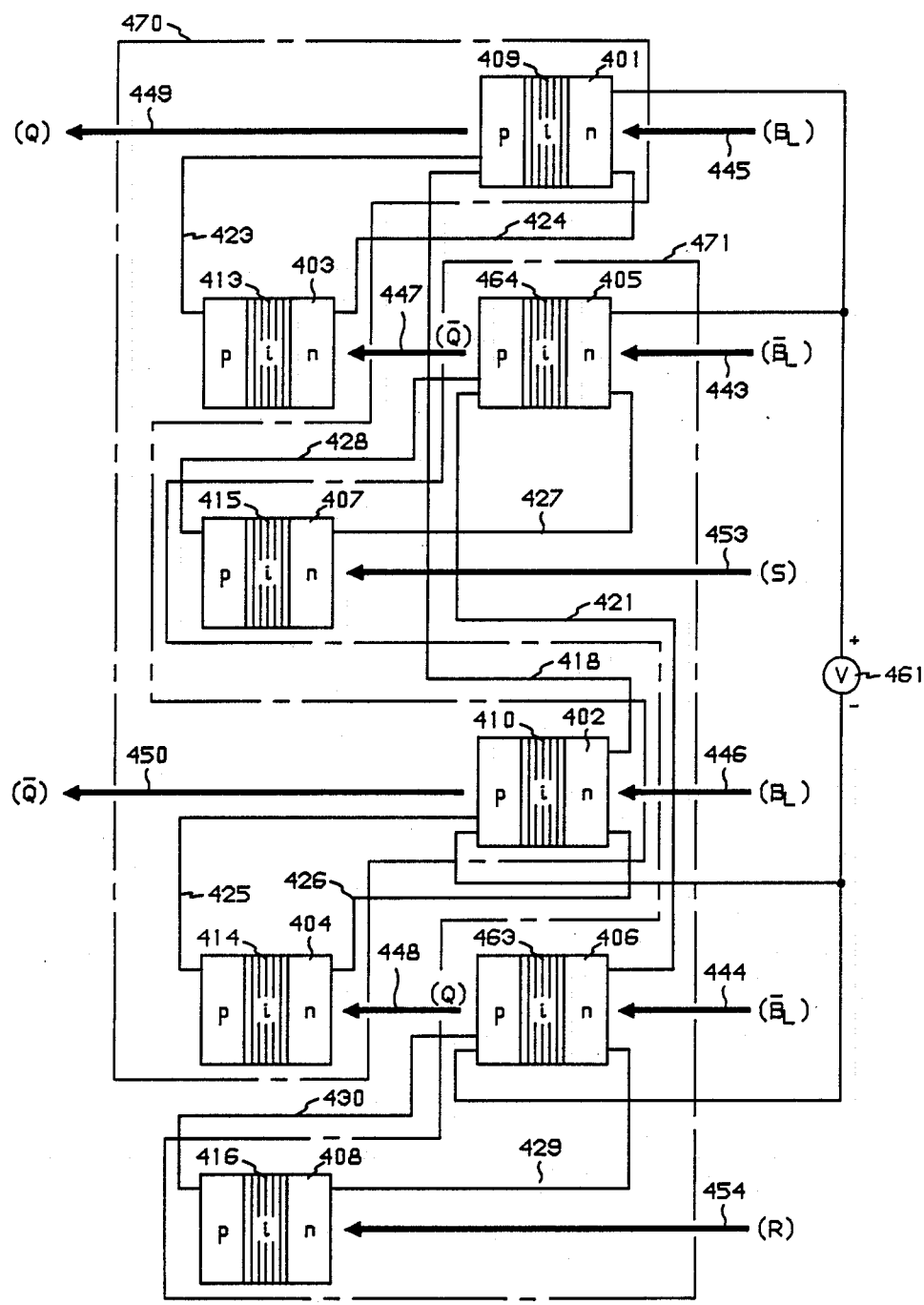
FIG. 4 is a schematic diagram of the same master-slave arrangement shown in FIG. 3 but illustrating the light beams used for left shifting in the linear shift register of FIG. 5.

FIG. 3 is a schematic diagram of a master-slave arrangement comprising a master flip-flop 470 cascaded with a slave flip-flop 471. Such master-slave arrangement is the basic unit of a linear shift register made by cascading several of the basic units. Master flip-flop 470 has been described previously with respect to FIG. 2. Slave flip-flop 471 is substantially identical and comprises a first pair of photodetectors 405 and 407 connected in parallel via conductors 427 and 428 and a second pair of photodetectors 406 and 408 connected in parallel via conductors 429 and 430. The first and second pairs of photodetectors are connected in series via conductor 421. Beams 435 and 436, transmitted from photodetectors 403 and 404 respectively, determine the absorption in the quantum well regions 415 and 416 to set the state of slave flip-flop 471. Substantially equal clock beams 439 and 440 read out the state of slave flip-flop 471. The output beams 451 and 452 have intensities dependent on the absorption in the quantum well regions 415 and 416. The master-slave arrangement is bidirectional in that data can be shifted from left to right or from right to left. FIG. 3 illustrates the light beams required for right shifting. FIG. 4 is a diagram showing the same master-slave arrangement of FIG. 3 illustrating the light beams required for left shifting. The physical arrangement of a monolithic structure implementing the cascaded S-SEEDS of FIGS. 3 and 4 is shown in FIG. 5. For clarity of presentation, the electrical connections between photodetectors shown in FIGS. 3 and 4 are omitted from FIG. 5. Note that in order for the structure of FIG. 5 to be capable of either right shifting or left shifting, all of the photodetectors must have quantum well regions because the roles of the photodetectors are reversed for left shifting.

There are three sets of input beams incident on the master-slave arrangement of FIG. 5. A first set of input beams 455 and 456 is used for right shifting operation and emanates from the complementary outputs of a previous master-slave arrangement to the left in FIG. 5 having output photodetectors 307 and 308 with quantum well regions 315 and 316 respectively. A second set of input beams 431 and 432 is receivable from an external source. A third set of input beams 453 and 454 is used for left shifting operation and emanates from the complementary outputs of a previous master-slave arrangement to the right in FIG. 5 having output photodetectors 501 and 502 with quantum well regions 509 and 510 respectively. The direction of shifting is determined by using only three of a possible five sets of clock beams and only one of a possible three sets of input beams.

To perform right shifting as shown in FIGS. 3 and 5, the first set of clock beams 433 and 434 reads out the state of master flip-flop 470 providing output beams 435 and 436 which become the input signal beams for slave flip-flop 471. The second set of clock beams 439 and 440 reads out the state of slave flip-flop 471 to provide output beams 451 and 452 as the input signal beams to a subsequent master-slave arrangement. A third set of clock beams 437 and 438, referred to herein as monitor beams, is shown only in FIG. 5. Beams 437 and 438 are incident on photodetectors 405 and 406 respectively to provide additional output beams 441 and 442. Output beams 441 and 442 are identical to output beams 451 and 452 respectively, and are usable to drive external devices. Clock beams 433 and 434 are complementary to clock beams 439 and 440; clock beams 433 and 434 are also complementary to monitor beams 437 and 438. This assures that signal beams and clock beams do not coincide in time.

To perform left shifting as shown in FIGS. 4 and 5, the fourth set of clock beams 443 and 444 and the fifth set of clock beams 445 and 446 are used rather than the first and second sets of clock beams. Beams 443 and 444 are incident on photodetectors 405 and 406 respectively, and beams 445 and 446 are incident on photodetectors 401 and 402 respectively, to effect left shifting. The monitor beams are usable for either direction of shifting. For left shifting, clock beams 445 and 446 are complementary to clock beams 443 and 444; clock beams 445 and 446 are also complementary to monitor beams 437 and 438.

Figure 6:
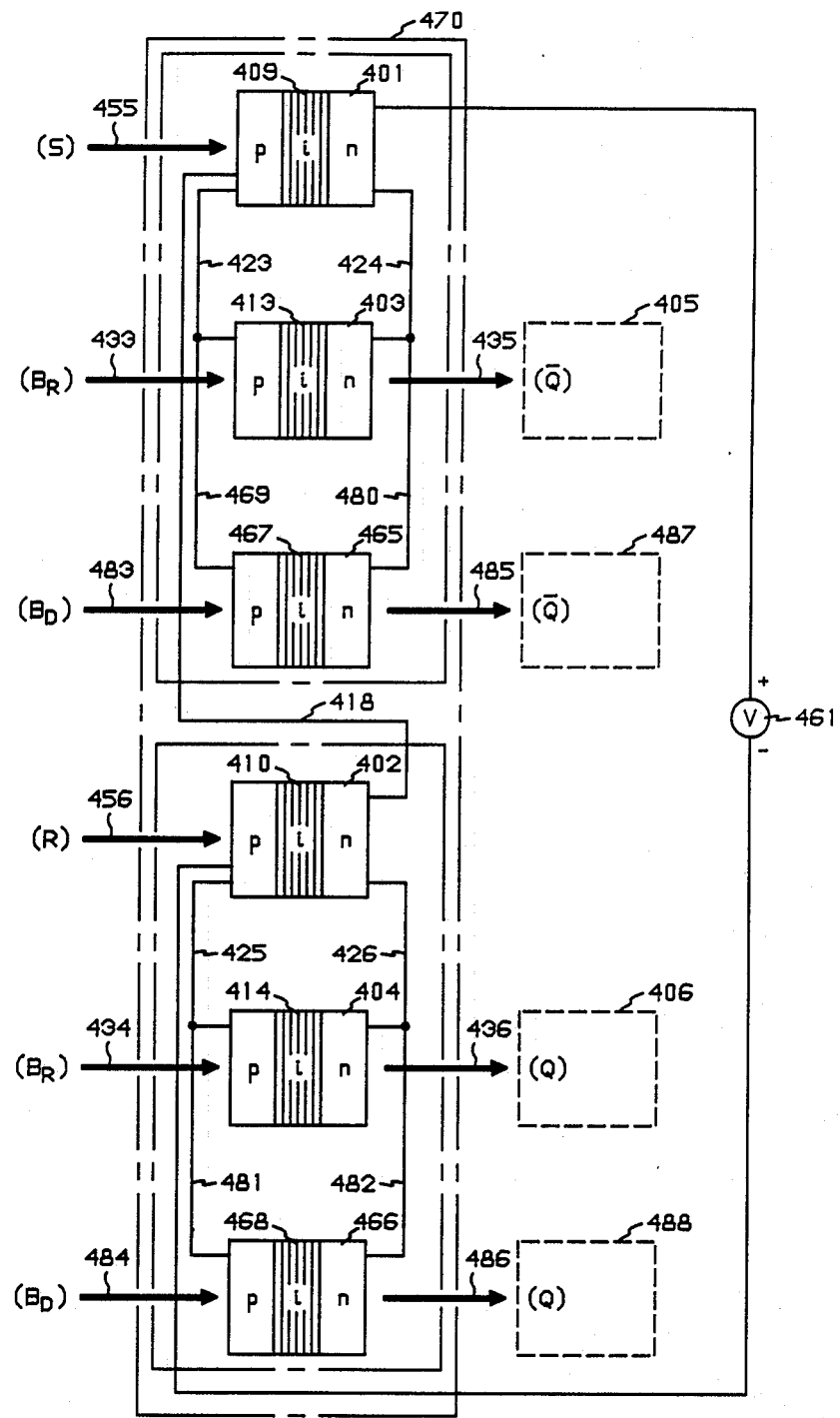
FIG. 6 is a schematic diagram of the components of a flip-flop similar to that of FIG. 2 but having a fan-out of two rather than one.

FIG. 6 is a schematic diagram of an S-SEED 473 similar to that of FIG. 2 but having two pairs of complementary output beams rather than one. The arrangement of FIG. 2 has a fan-out of one; the arrangement of FIG. 6 has a fan-out of two. In FIG. 6, an additional photodetector 465 having quantum well region 467 is connected in parallel with photodetector 403 via conductors 469 and 480. An additional photodetector 466 having quantum well region 468 is connected in parallel with photodetector 404 via conductors 481 and 482. An additional set of clock beams 483 and 484 provides an additional set of output beams 485 and 486. Output beams 485 and 486 become the input signal beams incident on a third S-SEED including receiving photodetectors 487 and 488. In effect, S-SEED 473 is a 1×2 switch. The output of S-SEED 473 can be directed to one S-SEED including photodetectors 405 and 406 and/or a second S-SEED including photodetectors 487 and 488 by turning on the set of clock beams 433 and 434 and/or the set of clock beams 483 and 484.

Figure 7:
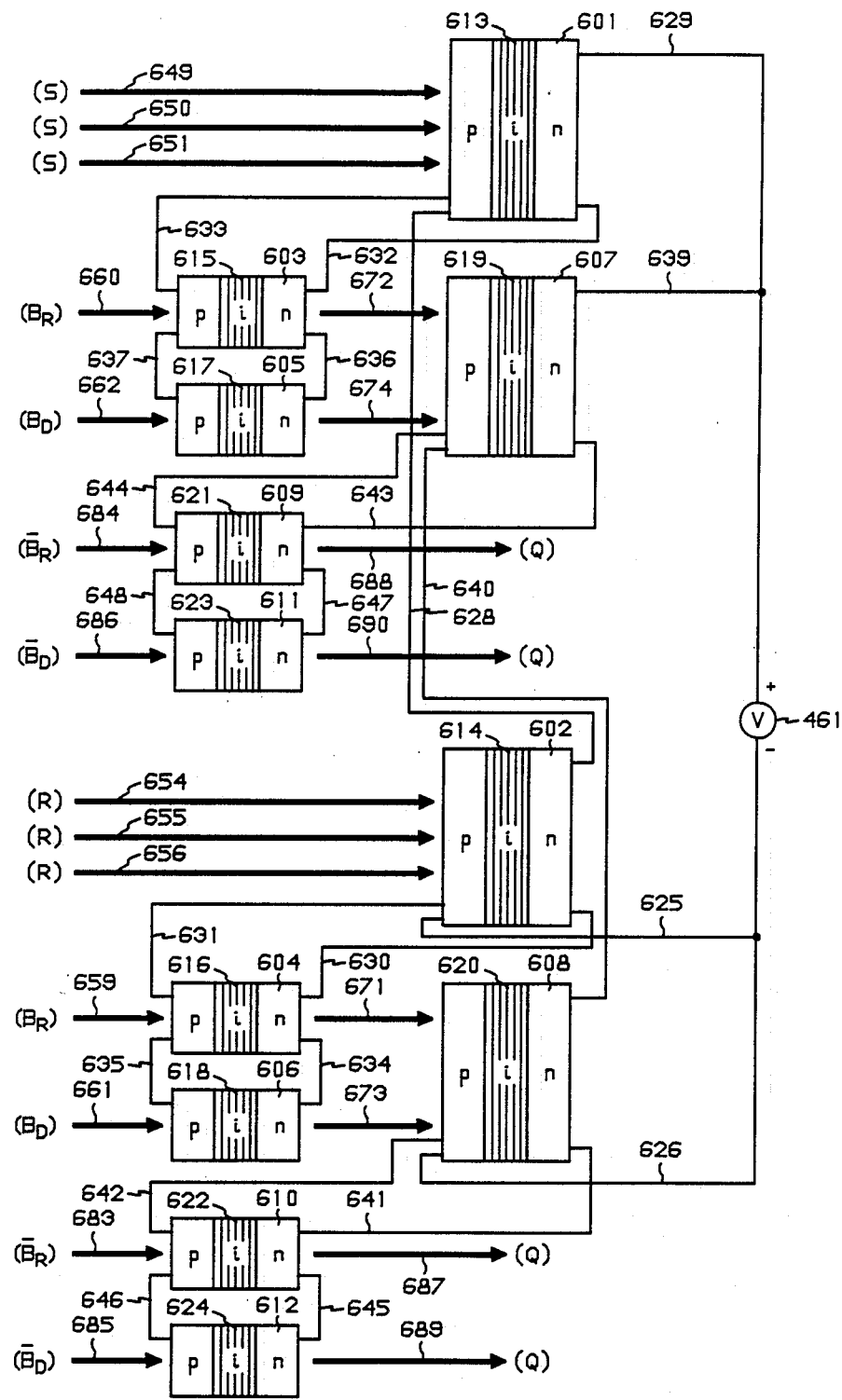
FIG. 7 is a schematic diagram of a master-slave arrangement comprising optically interconnected symmetric self electro-optic effect devices and illustrating the light beams used for right shifting and down shifting in the two-dimensional shift register of FIG. 9.

FIG. 7 is a schematic diagram of a master-slave arrangement that is the basic unit of a two-dimensional shift register that can shift data in any one of four planar directions (left, right, up, down). The accompanying physical structure is shown in FIG. 9. The layer structure is identical to the structure shown in FIGS. 1 and 5; the three layers that are shown in FIG. 9 correspond to the bottom photodetector, insulating layer, and upper photodetector of each mesa in FIG. 5. The master-slave arrangement has nine sets of clock beams and five sets of input beams. Each set of clock beams comprises two beams, one for each half of a S-SEED. The clock beams comprise right shifting clock beams, right shifting complementary clock beams, left shifting clock beams, left shifting complementary clock beams, down shifting clock beams, down shifting complementary clock beams, up shifting clock beams, and up shifting complementary clock beams. In addition there is a set of monitor clock beams that is synchronized with the complementary clock beams. The monitor clock beams are used to provide additional output light beams corresponding to the state of the master-slave arrangement. At most three sets of clock beams are on at a given time: the set of clock beams for a particular direction, the set of complementary clock beams for that direction, and, optionally, the monitor beams. The five sets of input beams comprise one set of input beams to provide for external input data, and sets of input beams from master-slave arrangements to the left, up, right, and down. There are five sets of output beams as well. One set of output beams results from the application of the monitor beams and the other four sets provide input beams to master-slave arrangements to the right, down, left, and up.

Figure 8:
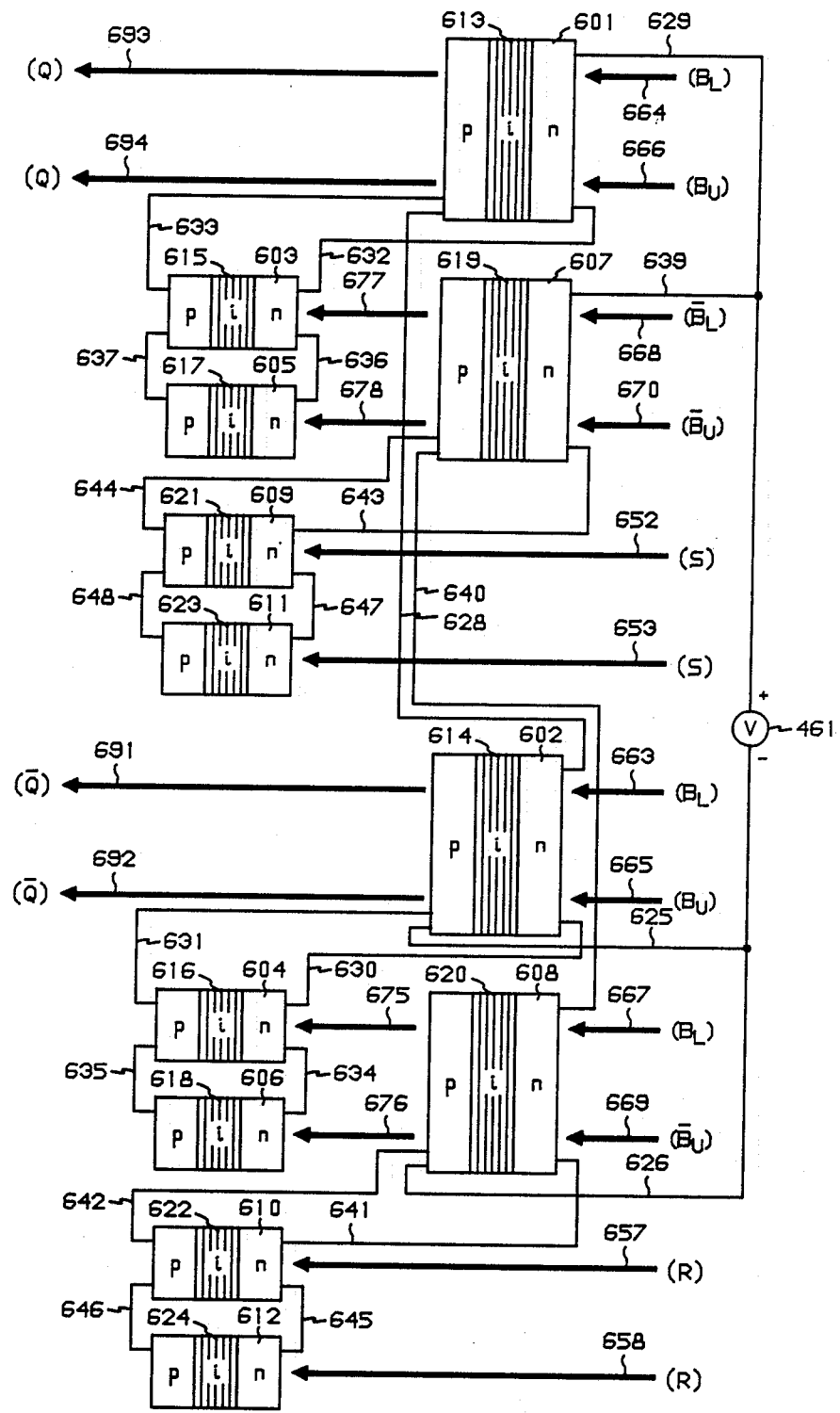
FIG. 8 is a schematic diagram of the same master-slave arrangement shown in FIG. 7 but illustrating the light beams used for left shifting and up shifting in the two-dimensional shift register of FIG. 9.

In the arrangement of FIGS. 7-9, a single S-SEED flip-flop comprises six photodetectors. A master flip-flop comprises photodetectors 601, 603, and 605 connected in parallel via conductors 632, 633, 636 and 637 and photodetectors 602, 604, and 606 connected in parallel via conductors 630, 631, 634, and 635. The two sets of parallel photodetectors are connected in series via conductor 628 and connected to DC voltage source 461 via conductors 625 and 629. A slave flip-flop comprises photodetectors 607, 609, and 611 connected in parallel via conductors 643, 644, 647 and 648 and photodetectors 608, 610, and 612 connected in parallel via conductors 641, 642, 645 and 646. The two sets of parallel photodetectors are connected in series via conductor 640 and connected to DC voltage source 461 via conductors 626 and 639. In the structure of FIG. 9, up to three layers of metalization may be required to provide the electrical connections.

For right shifting operation, the state of the master flip-flop is set using one of the sets of input beams incident on photodetectors 601 and 602. These sets comprise beams 654, 655, 656, 649, 650 and 651. Then the data is read out using the right shifting clock beams 659 and 660. The output beams 671 and 672 have intensities determined by the absorption in quantum well regions 615 and 616. Output beams 671 and 672 each propagate through an insulating layer and become the signal input beams incident on photodetectors 607 and 608 for the slave flip-flop. Then the right shifting complementary clock beams, 683 and 684, read out the state of the slave flip-flop, providing output beams 687 and 688. The output beams 687 and 688 have intensities determined by the absorption in quantum well regions 622 and 621 and become the input signal beams to the next master-slave flip-flop arrangement located physically to the right, including photodetectors 701 and 702 in FIG. 9. At the same time, monitor beams 679 and 680, which are synchronized with the complementary clock beams, provide output beams 681 and 682 that are substantially identical to output beams 687 and 688 and that are determined by the absorption in quantum well regions 619 and 620 of photodetectors 607 and 608, respectively.

For down shifting operation, the state of the master flip-flop is set using one of the sets of input beams incident on photodetectors 601 and 602. These sets comprise beams 654, 655, 656, 649, 650 and 651. Then the data is read out using the down shifting clock beams 661 and 662. The output beams 673 and 674 have intensities determined by the absorption in quantum well regions 617 and 618. Output beams 673 and 674 each propagate through an insulating layer and become the signal input beams incident on photodetectors 607 and 608 for the downward slave flip-flop. Then the down shifting complementary clock beams, 685 and 686, read out the state of the downward slave flip-flop, providing output beams 689 and 690. The output beams 689 and 690 have intensities determined by the absorption in quantum well regions 623 and 624 and become the input signal beams to the next master-slave flip-flop arrangement located physically downward, including photodetectors 801 and 802 in FIG. 9.

For left shifting operation, the data is read in via the input signal beams 652 and 657 incident on photodetectors 609 and 610 respectively. The left shifting complementary clock beams 668 and 667, incident on photodetectors 607 and 608 respectively, read out the state of the first flip-flop and provide output beams 675 and 677. The output beams 675 and 677 have intensities determined by the absorption in quantum well regions 620 and 619. The output beams propagate to photodetectors 603 and 604 where they become input beams, setting the state of the second flip-flop. Clock beams 663 and 664 are used to provide output beams 691 and 693 which serve as input beams for the next flip-flop to the left.

Up shifting operation is similar to left shifting operation except clock beams 669, 670, 665 and 666 are used and signal beams 653 and 658 are incident on photodetectors 611 and 612. The output beams 676 and 678 from the first flip-flop propagate to the second flip-flop and are incident on photodetectors 606 and 605 respectively. The output beams 692 and 694 become the input signal beams for the next flip-flop upward.

For all four directions of shifting, the monitor beams 679 and 680, which are synchronized with the complementary clock beams, provide output beams that can be used to drive external devices. In addition, there is provision for a set of external input beams.

FIG. 10 is a diagram of an illustrative 2×1 optical switch that may be constructed as a monolithic device in accordance with the invention. Photodetectors 901 and 902, connected in series via conductor 910, comprise a first S-SEED having input signal beams 923 and 925 set the state and clock beams 911 and 913 passing through quantum well regions 905 and 907 to provide output beams 912 and 914. Output beams 912 and 914 pass through an insulating layer of the monolithic structure (not shown) and are incident as input signal beams on a second S-SEED comprising photodetectors 801 and 802 connected in series via conductor 818. Photodetectors 801 and 802 have quantum well regions 809 and 810. Photodetectors 903 and 904, connected in series via conductor 909, comprise a third S-SEED having input signal beams 924 and 926 set the state and clock beams 915 and 917 passing through quantum well regions 906 and 908 to provide output beams 916 and 918. Electrical power is provided by DC voltage source 461. Output beams 916 and 918 pass through an insulating layer (not shown) and are incident as input signal beams on photodetectors 801 and 802. If clock beams 911 and 913 are turned off, the data on input signal beams 924 and 926 appears at output beams 921 and 922 after the state of the second S-SEED is read using complementary clock beams 919 and 920. Alternatively, if clock beams 915 and 917 are instead turned off, the data on input signal beams 923 and 925 appears at output beams 921 and 922 after the state of the second S-SEED is read using complementary clock beams 919 and 920.

The arrangement of FIG. 10 is usable as a 2×1 switch as described above where the clock beams are turned on or off to determine which input beams are selected. However, since there is an input beam pair incident on each of the two photodetectors of an S-SEED, each S-SEED is also usable to perform logic functions such as AND, OR, NAND, and NOR, by presenting both input beam pairs at the same time. Logic operation using S-SEEDS is described in the paper "Photonic Ring Counter and Differential Logic Gate Using Symmetric Self Electro-Optic Effect Devices", A. L. Lentine, D. A. B. Miller, J. E. Cunningham, and J. E. Henry, Conference on Lasers and Electro-Optics, Optical Society of America (1987). The arrangement of FIG. 10 is not monolithically cascadable with other such arrangements. To make the arrangement cascadable, photodetectors are added in parallel in a manner analogous so that shown herein for the two-dimensional shift register. Further, since the S-SEED is usable to perform logic functions, it is therefore possible to obtain monolithic structures that perform a variety of complex logic functions by interconnecting S-SEEDs, for example, a structure comprising a full adder or a programmable logic array.

It is to be understood that the above-described arrangements are merely illustrative of the principles of the invention and that many variations may be devised by those skilled in the art without departing from the spirit and scope of the invention. It is therefore intended that such variations be included within the scope of the claims.

We claim:
1. Apparatus comprising
a monolithic structure comprising a first group of photodetector layers including a quantum well region, and a second group of photodetector layers, where light transmitted through said quantum well region of said first group of photodetector layers is incident on siad second group of photodetector layers, said structure having a plurality of individual substructures formed therein each comprising a first photodetector from said first group of photodetector layers and a second photodetector from said second group of photodetector layers, and
means for electrically connecting ones of the first and second photodetectors of ones of said substructures for operation in a predefined electrical circuit comprising self electro-optic effect devices that are optically interconnected within individual ones of said substructures.
2. Apparatus in accordance with claim 1 wherein said connecting means comprises means for electrically connecting the second photodetector of a first one of said substructures in parallel with the first photodetector of a second one of said substructures for operation together with a load as a first self electro-optic effect device, and
means for electrically connecting the second photodetector of said second substructure in parallel with the first photodetector of a third one of said substructures for operation together with a load as a second self electro-optic effect device optically interconnected with said first self electro-optic effect device.
3. Apparatus in accordance with claim 1 wherein said connecting means comprises
means for electrically connecting the second photodetectors of a first pair of said substructures individually in parallel with respective first photodetectors of a second pair of said substructures for operation as a first symmetric self electro-optic effect device, and
means for electrically connecting the second photodetectors of said second pair of substructures individually in parallel with respective first photodetectors of a third pair of said substructures for operation as a second symmetric self electro-optic effect device optically interconnected with said first symmetric self electro-optic effect device.
4. Apparatus in accordance with claim 3 wherein said plurality of individual substructures is arranged as a planar array having two dimensions,
where, for each of said first, second and third pairs of substructures, the two substructures of a pair are aligned in a first one of said dimensions,
where said first, second and third pairs of substructures are aligned in a second one of said dimensions, and
where said second symmetric self electro-optic effect device is optically interconnected with said first symmetric self electro-optic effect device for shifting optical data in one direction of said second dimension.
5. Apparatus in accordance with claim 3 wherein said plurality of individual substructures is arranged as a planar array having two dimensions, wherein said second group of photodetector layers includes a quantum well region, where light transmitted through said quantum well region of said second group of photodetector layers is incident on said first group of photodetector layers,
where, for each of said first, second and third pairs of substructures, the two substructures of a pair are aligned in a first one of said dimensions,
where said first, second and third pairs of substructures are aligned in a second one of said dimensions, and
where said second symmetric self electro-optic effect device is optically interconnected with said first symmetric self electro-optic effect device for shifting optical data in either direction of said second dimension.
6. Apparatus in accordance with claim 1 wherein said connecting means comprises
means for electrically connecting the second photodetectors of a first pair of said substructures individually in parallel with respective first photodetectors of a second pair of said substructures and individually in parallel with respective first photodetectors of a third pair of said substructures for operation as a first symmetric self electro-optic effect device, means for electrically connecting the second photodetectors of said second pair of substructures individually in parallel with respective first photodetectors of a fourth pair of said substructures for operation as a second symmetric self electro-optic effect device optically interconnected with said first symmetric self electro-optic effect device, and means for electrically connecting the second photodetectors of said third pair of substructures individually in parallel with respective first photodetectors of a fifth pair of said substructures for operation as a third symmetric self electro-optic effect device optically interconnected with said first symmetric self electro-optic effect device.

7. Apparatus in accordance with claim 1 wherein each of said plurality of individual substructures comprises a plurality of first photodetectors from said first group of photodetector layers, said connecting means comprising means for electrically connecting the second photodetectors of a first pair of said substructures individually in parallel with respective pluralities of first photodetectors of a second pair of said substructures for operation as a first symmetric self electro-optic effect device, means for electrically connecting the second photodetectors of said second pair of substructures individually in parallel with respective first photodetectors of a third pair of said substructures for operation as a second symmetric self electro-optic effect device optically interconnected with said first symmetric self electro-optic effect device, and means for electrically connecting said second photodetectors of said second pair of substructures individually in parallel with respective first photodetectors of a fourth pair of said substructures for operation as a third symmetric self electro-optic effect device optically interconnected with said first symmetric self electro-optic effect device.

8. Apparatus in accordance with claim 7 where said plurality of individual substructures is arranged as a planar array having two dimensions, where, for each of said first, second, third and fourth pairs of substructures, the two substructures of a pair are aligned in a first one of said dimensions, where said first, second and third pairs of substructures are aligned in a second one of said dimensions, where said first and fourth pairs of substructures are aligned in said first dimension, where said second self electro-optic device is optically interconnected with said first symmetric self electro-optic effect device for shifting optical data in one direction of said second dimension, and where said third symmetric self electro-optic device is optically interconnected with said first symmetric self-electro-optic device for shifting optical data in one direction of said first dimension.

9. Apparatus in accordance with claim 7 wherein said plurality of individual substructures is arranged as a planar array having two dimensions, wherein said second group of photodetector layers includes a quantum well region, where light transmitted through said quantum well region of said second group of photodetector layers is incident on said first group of photodetector layers, where, for each of said first, second, third and fourth pairs of substructures, the two substructures of a pair are aligned in a first one of said dimensions, where said first, second and third pairs of substructures are aligned in a second one of said dimensions, where said first and fourth pairs of substructures are aligned in said first dimension, where said second self electro-optic device is optically interconnected with said first symmetric self electro-optic effect device for shifting optical data in either direction of said second dimension, and where said third symmetric self electro-optic device is optically interconnected with said first symmetric self-electro-optic device for shifting optical data in either direction of said first dimension.

10. Apparatus in accordance with claim 1 wherein said second group of photodetector layers includes a quantum well region, wherein each of said individual substructures further comprises a third photodetector from said first group of photodetector layers, and wherein said connecting means comprises means for electrically connecting the first photodetectors of first and second ones of said substructures in series for operation as a first symmetric self electro-optic effect device, means for electrically connecting the third photodetectors of said first and second substructures in series for operation as a second symmetric self electro-optic effect device, and means for electrically connecting the second photodetectors of said first and second substructures in series for operation as a third symmetric self electro-optic effect device.

11. Apparatus in accordance with claim 10 wherein said first, second and third symmetric self electro-optic effect devices operate collectively as an optical switch.

12. Apparatus in accordance with claim 10 wherein said first, second and third symmetric self electro-optic effect devices operate as optical logic gates.

13. Apparatus in accordance with claim 1 wherein said monolithic structure further comprises
an insulating layer interposed between said first and second groups of photodetector layers.

14. Apparatus comprising
a monolithic structure comprising first, second, third, and fourth photodetector means each responsive to light for generating photocurrent and each comprising a plurality of layers, said second and fourth photodetector means each having a quantum well region for transmitting light and each being spaced apart from said first and third photodetector means, respectively, and said second and third photodetector means being positioned in said structure such that light transmitted from said second photodetector means in incident on said third photodetector means, means for electrically connecting selected individual layers of said first and second photodetector means, means for electrically connecting selected individual layers of said third and fourth photodetector means, and means, responsive to photocurrent generated by said first photodetector means in response to a first light beam incident thereon and to photocurrent generated by said second photodetector means in response to a second light beam incident thereon, for electrically controlling optical absorption of the quantum well region of said second photodetector means, said second photodetector means being responsive to said second light beam incident thereon for transmitting said second light beam therethrough, said device further comprising means, responsive to photocurrent generated by said third photodetector means in response to said transmitted second light beam incident thereon and to photocurrent generated by said fourth photodetector means in response to a third light beam incident thereon, for electrically controlling optical absorption of the quantum well region of said fourth photodetector means.

15. Apparatus comprising a monolithic structure comprising first, second, third, fourth, fifth, sixth, seventh, and eighth photodetector means each responsive to light for generating photocurrent and each comprising a plurality of layers, said second, fourth, sixth, and eighth photodetector means each having a quantum well region for transmitting light and each being spaced apart from said first, third, fifth, and seventh photodetector means, respectively, said second and third photodetector means being positioned in said structure such that light transmitted from said second photodetector means is incident on said third photodetector means, said sixth and seventh photodetector means being positioned in said structure such that light transmitted from said sixth photodetector means is incident on said seventh photodetector means, means for electrically connecting selected individual layers of said first and second photodetector means, means for electrically connecting selected individual layers of said third and fourth photodetector means, means for electrically connecting selected individual layers of said fifth and sixth photodetector means, and means for electrically connecting selected individual layers of said seventh and eighth photodetector means, where optical absorption of the quantum well region of said second photodetector means and optical absorption of the quantum well region of said sixth photodetector means are controllable based on photocurrent generated by said first photodetector means in response to a first light beam incident thereon, photocurrent generated by said second photodetector means in response to a second light beam incident thereon, photocurrent generated by said fifth photodetector means in response to a fourth light beam incident thereon, and photocurrent generated by said sixth photodetector means in response to a fifth light beam incident thereon, said second photodetector means being responsive to said second light beam incident thereon for transmitting said second light beam, said sixth photodetector means being responsive to said fourth light beam incident thereon for transmitting said fourth light beam, and where optical absorption of the quantum well region of said fourth photodetector means and optical absorption of the quantum well region of said eighth photodetector means are controllable based on photocurrent generated by said third photodetector means in response to said transmitted second light beam incident thereon, photocurrent generated by said fourth photodetector means in response to a third light beam incident thereon, photocurrent generated by said seventh photodetector means in response to said transmitted fourth light beam incident thereon, and photocurrent generated by said eighth photodetector means in response to a sixth light beam incident thereon.

* * * * *